(12) United States Patent
Choi et al.

(10) Patent No.: US 9,424,933 B2
(45) Date of Patent: Aug. 23, 2016

(54) NONVOLATILE MEMORY SYSTEM, METHOD OF OPERATING THE SAME AND METHOD OF MANUFACTURING THE SAME

(71) Applicant: SAMSUNG ELECTRONICS CO., LTD., Suwon-Si, Gyeonggi-Do (KR)

(72) Inventors: In-Hwan Choi, Gyeonggi-do (KR); Songho Yoon, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/569,174

(22) Filed: Dec. 12, 2014

(65) Prior Publication Data

US 2015/0294723 A1 Oct. 15, 2015

(30) Foreign Application Priority Data

Apr. 14, 2014 (KR) ........................ 10-2014-0044333

(51) Int. Cl.
| | |
|---|---|
| *G11C 16/22* | (2006.01) |
| *G06F 12/02* | (2006.01) |
| *G06F 12/14* | (2006.01) |
| *G11C 16/10* | (2006.01) |
| *G11C 11/56* | (2006.01) |
| *G11C 16/26* | (2006.01) |
| *G11C 16/34* | (2006.01) |
| *G11C 16/20* | (2006.01) |
| *G11C 7/24* | (2006.01) |
| *G06F 3/06* | (2006.01) |

(52) U.S. Cl.
CPC ............ *G11C 16/10* (2013.01); *G11C 11/5628* (2013.01); *G11C 11/5671* (2013.01); *G11C 16/20* (2013.01); *G11C 16/26* (2013.01); *G11C 16/3459* (2013.01); *G06F 3/064* (2013.01); *G06F 3/0647* (2013.01); *G06F 12/02* (2013.01); *G06F 12/0238* (2013.01); *G11C 7/24* (2013.01); *G11C 16/22* (2013.01); *G11C 2211/5641* (2013.01)

(58) Field of Classification Search
CPC ........ G11C 16/22; G11C 7/24; G06F 3/0647; G06F 12/02; G06F 3/064; G06F 12/0238
USPC ........... 365/185.04, 185.03, 185.11; 711/165, 711/170, E12.002
See application file for complete search history.

(56) References Cited

U.S. PATENT DOCUMENTS

| | | | | |
|---|---|---|---|---|
| 6,505,317 B1 * | 1/2003 | Smith | ............ | G01R 31/318505 714/724 |
| 8,180,931 B2 | 5/2012 | Lee et al. | | |

(Continued)

OTHER PUBLICATIONS

Anthony Ambrose, "Programming Matters MLC NAND Reliability and Best Practices for Data Retention (Data I/O Corporation)", Flash Memory Summit 2013.

*Primary Examiner* — Ly D Pham
(74) *Attorney, Agent, or Firm* — F. Chau & Associates, LLC

(57) ABSTRACT

An operating method of a nonvolatile memory system including first and second areas is provided. Data stored in the first area is migrated to the second area when a first booting operation is performed. The data stored in the second area is reprogrammed. The first booting operation is a booting operation performed when the nonvolatile memory system is first powered on after mounted on a printed circuit board. The reprogramming is a program operation performed on the data stored in the second area without performing an erasing operation on the data stored in the second area.

12 Claims, 16 Drawing Sheets

(56) References Cited

U.S. PATENT DOCUMENTS

| | | |
|---|---|---|
| 8,254,170 B2 | 8/2012 | Eli et al. |
| 8,260,818 B1 | 9/2012 | Polydov |
| 8,321,597 B2 | 11/2012 | Yu et al. |
| 2004/0059906 A1* | 3/2004 | Park .................. G06F 9/4406 713/2 |
| 2005/0047594 A1* | 3/2005 | Cho ..................... G06F 21/80 380/59 |
| 2008/0189485 A1 | 8/2008 | Jung et al. |
| 2009/0161466 A1 | 6/2009 | Hamilton et al. |
| 2010/0199081 A1 | 8/2010 | Lee et al. |
| 2011/0038238 A1* | 2/2011 | Fujiwara ............. G06F 9/4406 369/30.07 |
| 2011/0107049 A1 | 5/2011 | Kwon et al. |
| 2011/0199823 A1 | 8/2011 | Bar-Or et al. |
| 2012/0173792 A1 | 7/2012 | Lassa et al. |
| 2012/0284574 A1 | 11/2012 | Avila et al. |
| 2012/0297122 A1 | 11/2012 | Gorobets et al. |
| 2013/0024609 A1 | 1/2013 | Gorobets et al. |
| 2013/0238559 A1* | 9/2013 | Bushman ......... G06F 17/30079 707/639 |
| 2013/0308390 A1 | 11/2013 | Lee |

* cited by examiner

NONVOLATILE MEMORY SYSTEM, METHOD OF OPERATING THE SAME AND METHOD OF MANUFACTURING THE SAME

CROSS-REFERENCE TO RELATED APPLICATION

This application claims priority under 35 U.S.C. §119 to Korean Patent Application No. 10-2014-0044333, filed on Apr. 14, 2014 in the Korean Intellectual Property Office, the disclosure of which is incorporated by reference herein in its entirety.

TECHNICAL FIELD

The present inventive concept relates to a nonvolatile memory system and a method of operating the same.

DISCUSSION OF RELATED ARTS

Charge trap flash (CTF) memory cells are non-volatile memory cells. The CTF memory cells store a program state (or data) by storing a charge in a charge storage layer. Threshold voltage distributions of the CTF memory cells may vary as charges stored in the charge storage layer are flowed into a channel after the CTF memory cells are programmed.

SUMMARY

According to an exemplary embodiment of the inventive concept, an operating method of a nonvolatile memory system including first and second areas is provided. Data stored in the first area is migrated to the second area when a first booting operation is performed. The data stored in the second area is reprogrammed. The first booting operation is a booting operation performed when the nonvolatile memory system is first powered on after mounted on a printed circuit board. The reprogramming is a program operation performed on the data stored in the second area without performing an erasing operation on the data stored in the second area.

According to an exemplary embodiment of the inventive concept, a nonvolatile memory system is provided. The nonvolatile memory system includes a nonvolatile memory and a memory controller. The nonvolatile memory includes first and second areas. Each of the first and second areas includes a plurality of memory blocks. The memory controller is configured to write data in the first and second areas or read out data written in the first and second areas. The memory controller is further configured to write an operating system image in the first area on the basis of a first programming scheme, read the operating system image written in the first area when a first booting is performed, write the read operating system image in the second area on the basis of a second programming scheme, and reprogram the second area in which the operating system image is written. The first booting is a booting operation performed when the nonvolatile memory system is first powered on after mounted on a printed circuit board. The reprogram operation is a program operation performed on the data written in the second area without performing an erasing operation on the data stored in the second area.

According to an exemplary embodiment of the inventive concept, a method of manufacturing a user system is provided. An application processor is mounted on a printed circuit board (PCB). A memory system including a memory controller and a nonvolatile memory is mounted on the PCB. An operating system image is written to a first region of the nonvolatile memory using a single level cell operation, before the memory system is mounted on the PCB. The operating system image is migrated from the first area to the second area using a multi level cell operation in a first booting operation. The operating system image stored in the second area is reprogrammed without performing an erase operation on the second area.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
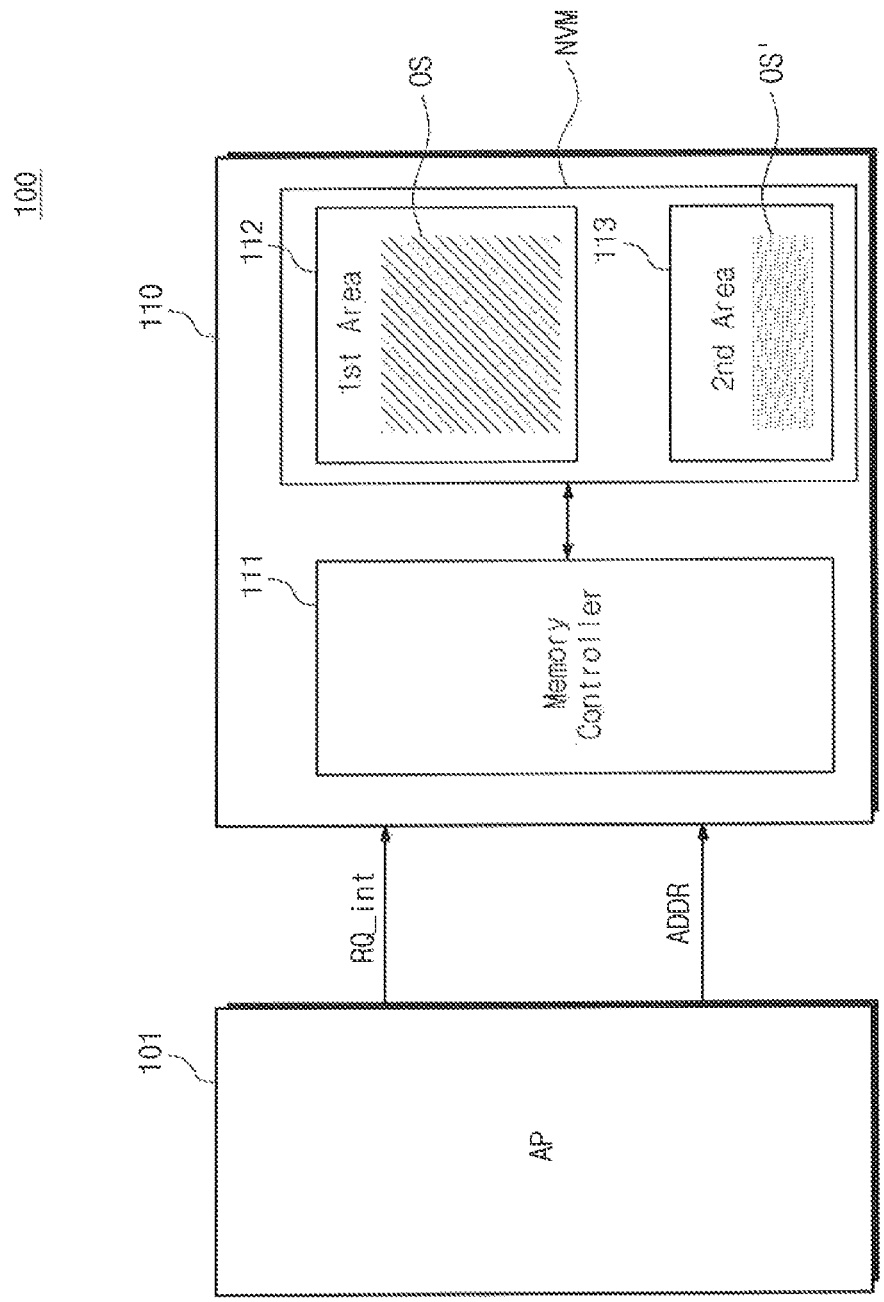
FIG. 1 is a block diagram illustrating a user system in accordance with an exemplary embodiment of the inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

A nonvolatile memory system in accordance with exemplary embodiments of the inventive concept includes a nonvolatile memory device including first and second areas and a memory controller. The memory controller programs data (e.g., an operating system image) in the first area. At this time, the memory controller programs data in the first area on the basis of a first programming scheme (e.g., a single level cell (SLC) programming scheme).

After data is written in the first area, the nonvolatile memory system is mounted on a printed circuit board (PCB) using a surface mount technology (SMT). When the nonvolatile memory system is first booted after the nonvolatile memory system is mounted on the PCB, the memory controller reads data stored in the first area and then program the data (i.e., the operating system image) in the second area. At this time, the memory controller programs the data in the second area on the basis of a second programming scheme (e.g., multi level cell (MLC) programming scheme). After that, the memory controller reads data stored in the first or second area and reprogram the read data in the second area. Thus, the reliability of the operating system image is increased, and a nonvolatile memory system having increased reliability is provided.

FIG. 1 is a block diagram illustrating a user system in accordance with an embodiment of the inventive concept. Referring to FIG. 1, a user system 100 includes an application processor (AP) 101 and a nonvolatile memory system 110. The user system 100 may be provided by one of computing systems such as an ultra mobile PC (UMPC), a workstation, a net-book, a personal digital assistants (PDA), a portable computer, a web tablet, a tablet computer, a wireless phone, a mobile phone, a smart phone, an e-book, a portable multimedia player (PMP), a portable game machine, a navigation device, a black box, a digital camera, a digital multimedia broadcasting (DMB) player, a three dimensional television, a smart television, a digital audio recorder, a digital audio player, a digital picture recorder, a digital picture player, a digital video recorder, a digital video player, etc.

The application processor (AP) 101 operates constituent elements using an operating system of the user system 100. The application processor 101 may include controllers controlling constituent elements included in the user system 100, interfaces, a graphic engine, etc. The AP 101 may be provided by a system-on-chip (SoC).

The nonvolatile memory system 110 stores data or outputs the stored data. For example, the nonvolatile memory system 110 receives data from the application processor 101 and stores the received data. The nonvolatile memory system 110 transmits data stored in the nonvolatile memory system 110 to the application processor 101. The nonvolatile memory system 110 and the application processor 101 communicate to each other using at least one of various interfaces such as a universal serial bus (USB protocol, a multimedia card (MMC) protocol, an embedded MMC (eMMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a mobile industry processor interface (MIPI) protocol, a nonvolatile memory-express (NVMe) protocol, a NAND interface protocol, etc.

The nonvolatile memory system 110 includes a memory controller 111 and a nonvolatile memory device NVM. The nonvolatile memory device NVM includes first and second areas 112 and 113. The memory controller 111 writes data to at least one of the first and second areas 112 and 113, or read data from at least one of the first and second areas 112 and 113. For example, the first and second areas 112 and 113 may be implemented by one nonvolatile memory device, one chip, or one package.

The first and second areas 112 and 113 may include a plurality of memory blocks. Each memory block may include a plurality of memory cells. Each memory cell may be set to operate as a single level cell (SLC) storing 1-bit data or a multi level cell (MLC) storing at least 2-bit data.

The nonvolatile memory system 110 stores an operating system image OS including files, data, program codes related to an operating system. The application processor 101 operates various constituents of the user system 100 according to the operating system. The application processor 101 loads the operating system image OS stored in the nonvolatile memory system 110 into its memory in a booting operation.

The application processor 101 and the nonvolatile memory system 110 may be provided in one package, one chip or one module. Alternatively, the application processor 101 and the nonvolatile memory system 110 may be provided in different packages, different chips or different modules. The nonvolatile memory system 110 may be provided into a storage medium such as a multimedia card (MMC), an embedded MMC (eMMC), a solid state drive (SSD), a universal flash storage (UFS), and so on.

For example, the application processor 101 and the nonvolatile memory system 110 may be mounted on a printed circuit board (PCB) using a surface mount technology (SMT). Using the surface mount technology (SMT), a high temperature may be applied to the application processor 101 and the nonvolatile memory system 110 to mount the application processor 101 and the nonvolatile memory system 110 on the printed circuit board. Due to such high temperature, memory cells of the nonvolatile memory system 110 are deteriorated. For example, data stored in the nonvolatile memory system 110 may be lost due to shifts in threshold voltages of memory cells.

The nonvolatile memory system 110 programs an operating system image OS in the first area 112 on the basis of the first programming scheme before the nonvolatile memory system 110 is mounted on a printed circuit board on the basis of the surface mount technology (SMT). The first programming scheme may be a single level cell programming scheme.

After the operating system image OS is programmed in the first area 112, the nonvolatile memory system 110 is mounted on a printed circuit board using the surface mount technology (SMT). After that, the user system 100 is first booted. The first booting indicates a booting being performed when a power is first applied to the user system 100 after the nonvolatile memory system 110 is mounted on a printed circuit board using the surface mount technology (SMT). When the first booting is performed, the application processor 101 transmits an initial operation request RQ_int and an address ADDR to the nonvolatile memory system 110. The nonvolatile memory system 110, in response to the initial operation request RQ_int, reads an operating system image OS stored in the first area 112 and program the read operating system image OS in the second area 113 on the basis of the second programming scheme. The second programming scheme may be a multi level cell programming scheme. The address ADDR may include an address for memory blocks of the second area 113 in which the operating system image OS is to be stored.

After that, the nonvolatile memory system 110 performs a reprogram operation on the operating system image OS stored in the second area 113. Such reprogram operation may increase the reliability of the operating system image OS'. The reprogram operation indicates an operation of reprogramming the operating system image OS' stored in the second area 113 without erasing the operating system OS' image stored in the second area 113. The reprogram operation may serve to recharge memory cells included in the second area 113 to compensate for the charge loss in the process of SMT technology or after the operating image OS' is written to the second area 113.

Figure 2:
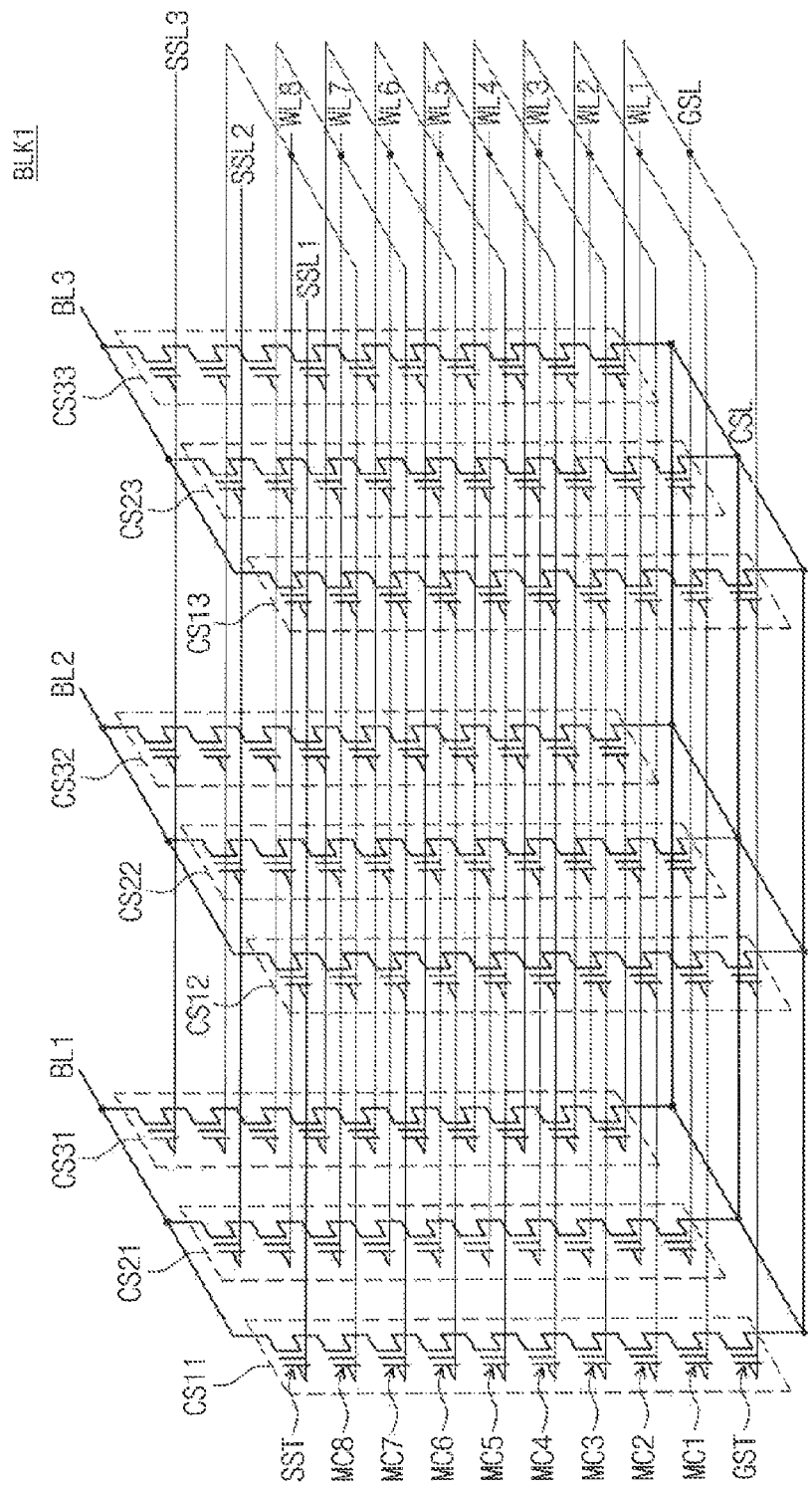
FIG. 2 is a circuit illustrating one memory block of a plurality of memory blocks included in a first area of a nonvolatile memory of FIG. 1.

FIG. 2 is a circuit illustrating one memory block among a plurality of memory blocks included in the first area 112 of FIG. 1. A first memory block BLK1 included in the first area 112 is described with reference to FIG. 2. However, the inventive concept is not limited to the first memory block BLK1 and other memory blocks included in the first area 112 and memory blocks included in the second area 113 may also have similar structure as the first memory block BLK1.

Referring to FIG. 2, the first memory block BLK1 includes a plurality of cell strings CS11~CS13, CS21~CS23 and CS31~CS33. The cell strings CS11~CS13, CS21~CS23 and CS31~CS33 are connected between bit lines BL1~BL3 and a common source line CSL. Each of the cell strings CS11~CS13, CS21~CS23 and CS31~CS33 includes a string select transistor SST, a plurality of memory cells MC1~MC8 and a ground select transistor GST.

String select transistors SST are connected to string select lines SSL1~SSL3, respectively. The memory cells MC1~MC8 are connected to a plurality of word lines WL1~WL8, respectively. The ground select transistors GSL are connected to a ground select line GSL. The string select transistors SST are connected to the bit lines BL1~BL3, respectively, and the ground select transistors GST are connected to the common source line CSL. Memory cells positioned at substantially the same height are connected in common to one of the word lines WU WL8. In operation, in the case of programming memory cells connected to the first word line WL1 and included in the cell strings CS11~CS13, the first word line WL1 and the first string select line SSL1 may be selected or activated.

The cell strings CS11~CS13, CS21~CS23 and CS31~CS33 may be formed in a direction perpendicular to a substrate (not shown), and the string select transistor SST, the memory cells MC1~MC8 and the ground select transistor GST may be stacked in a direction perpendicular to the substrate (not shown).

The first memory block BLK1 has a three-dimensional structure. The memory cells MC1~MC8 may be charge trap flash (CTF) memory cells. The charge trap flash (CTF) memory cells trap charges in a charge storage layer to store data.

The structure of the first memory block BLK1 of FIG. 2 is illustrative. The inventive concept is not limited thereto. For example, the number of rows of the cell strings may increase or decrease. As the number of rows of the cell strings is changed, the number of ground select lines or string select lines being connected to rows of the cell strings and the number of cell strings being connected to one bit line may also be changed.

The number of columns of the cell strings may increase or decrease. As the number of columns of the cell strings is changed, the number of bit lines being connected to columns of the cell strings, and the number of the cell strings being connected to one string selection line are also changed.

A height of the cell strings may increase or decrease depending on the number of memory cells stacked on each other. As the number of memory cells being stacked on in each cell string is changed, the number of word lines may also be changed. The number of string select transistors or ground select transistors being provided to each cell string may increase. As the number of string select transistors or ground select transistors being provided to each cell string is changed, the number of string select lines or ground select lines may also be changed. If the number of string select transistors or ground select transistors increases, the string select transistors or ground select transistors may be stacked in the same form as the memory cells MC1~MC8.

A write operation or a read operation may be performed by a row unit of the cell strings CS11~CS33. The cell strings CS11~CS33 may be selected by a row unit by the string select lines SSL1~SSL3.

A write operation or a read operation may be performed by a page unit in a selected row of the cell strings CS11~CS33. The page may be a row of memory cells connected to one word line. Memory cells may be selected by a page unit by the word lines WL1~WL8 in a selected row of the cell strings CS11~CS33.

Figure 3:
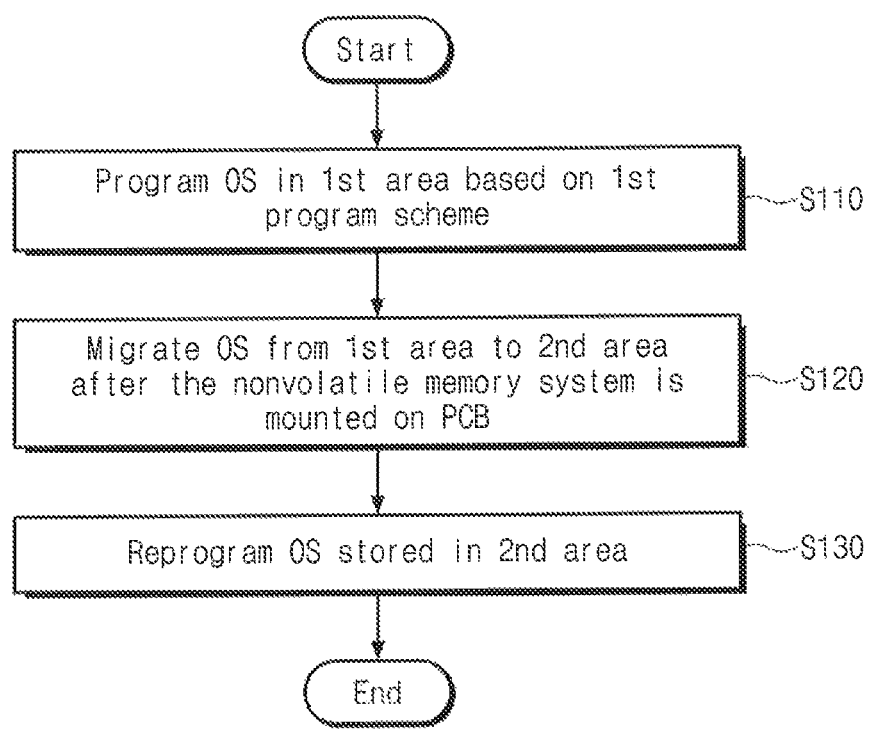
FIG. 3 is a flow chart illustrating an operation of a nonvolatile memory system illustrated in FIG. 1.

FIG. 3 is a flow chart illustrating an operation of a nonvolatile memory system illustrated in FIG. 1. For brevity of description, it will be assumed that an operating system image OS is a storage image including files, data, or program codes related to the operating system of the user system 100. However, the inventive concept is not limited thereto and the operating system image OS of the inventive concept may be data being required for high reliability including data being written or read in a manufacturing process of the user system 100 such as a vendor program. The operating system image OS of the inventive concept may be a firmware including a flash translation layer FTL controlling an operation of the nonvolatile memory system 110.

Referring to FIGS. 1 and 3, in step S110, data is written to the first area 112 of the nonvolatile memory system 110 on the basis of the first programming scheme. The first programming scheme may be a single level cell programming scheme. The data written to the first area 112 in step S110 may be referred to as an operating system image OS which was described above.

In step S120, after the nonvolatile memory system 110 is mounted on a printed circuit board PCB, the operating system image OS stored in the first area 112 is migrated to the second area 113. For example, the nonvolatile memory system 110 may be mounted on the printed circuit board (PCB) using the surface mount technology (SMT), After that, the nonvolatile memory system 110 may be electrically connected so that the application processor 101 starts a first booting operation.

The first booting operation indicates a booting operation performed when a power is first supplied to the nonvolatile memory system 110 after the nonvolatile memory system 110 is mounted on a printed circuit board. When the first booting operation is performed, the application processor 101 transmits an initial operation request RQ_int to the nonvolatile memory system 110. The nonvolatile memory system 110 migrates the operating system image OS stored in the first area 112 to the second area 113 in response to the initial operation request RQ_int from the application processor 101. For example, the nonvolatile memory system 110, in response to the initial operation request RQ_int, reads the operating system image OS stored in the first area 112 and then writes the read operating system image OS in the second area 113 on the basis of the second programming scheme.

In exemplary embodiments, the second programming scheme may be a multi level cell programming scheme. In exemplary embodiments, the number of memory cells included in the second area 113 in which the operating system OS' image is stored may be smaller than the number of memory cells included in the first area 112 in which the operating system image OS is stored.

In step S130, the nonvolatile memory system 110 reprograms the operating system image OS stored in the second area 112. For example, after the nonvolatile memory system 110 completes the migration operation of step S120, the nonvolatile memory system 110 reads the operating system image OS stored in the first area 112 and then reprograms the operating system image OS in the second area 113. Unlike a copy-back or merge operation, the reprogramming of the operating system image OS is performed without erasing the memory block, the sub block, or the page in which the operating system image OS is stored. For example, the reprogram operation may compensate charge loss caused by a physical characteristic of memory cells such as an initial verifying shift (IVS), a retention, etc. Such charge loss may be increased by the high temperature applied in the process of SMT.

After the reprogram operation of step S130 is completed, the operating system image OS of the first area 112 may be invalidated. After the reprogram operation is completed, the nonvolatile memory system 110 may erase the first area 112. The erased first area 112 may be used as a storage area of the nonvolatile memory system 110. The erased first area 112 may be written for a storage area on the basis of the second programming scheme.

According to an exemplary embodiment of the inventive concept, the nonvolatile memory system 110 may increase reliability of the operating system image OS by reprogramming the operating system image OS once the operating system image OS is migrated into the second area using the second programming scheme. Thus, an operating method of the nonvolatile memory system in accordance with an exemplary embodiment is provided.

Figure 4:
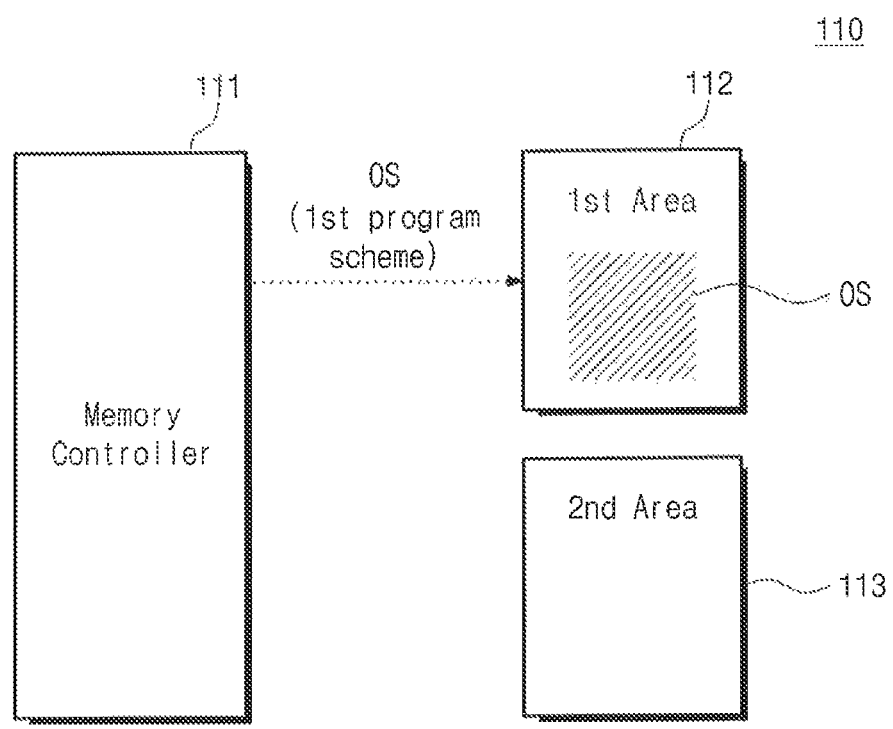
FIGS. 4 and 5 show step S110 of FIG. 3.
Figure 5:
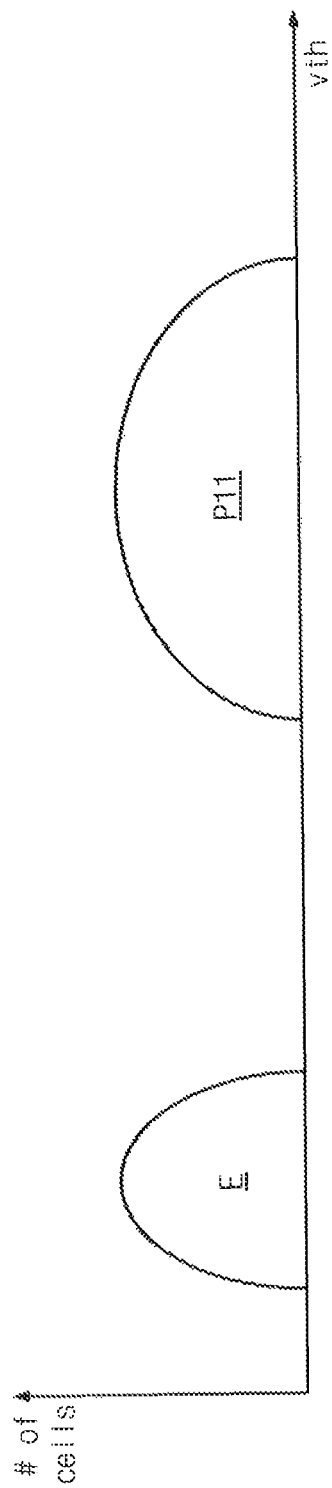

FIGS. 4 and 5 are drawings for showing step S110 of FIG. 3.

Referring to FIGS. 1, 3, 4 and 5, an operating system image OS is written in the first area 112 on the basis of the first programming scheme. The first programming scheme may be a single level cell programming scheme. The single level cell programming scheme includes an erase state E and a program state P11, If memory cells are written using the single level cell programming scheme, the memory cells have one of the erase state F and the program state P11.

The threshold voltage distributions of the erase state E and the program state P11 is such that data stored in the memory cells is less likely to be lost due to high temperature applied in a manufacturing process such as a surface mount technology. The operating system image OS in the first area 112 may be remain after the nonvolatile memory system 110 is mounted on the printed circuit board (PCB) using a surface mount technology (SMT).

Figure 6:
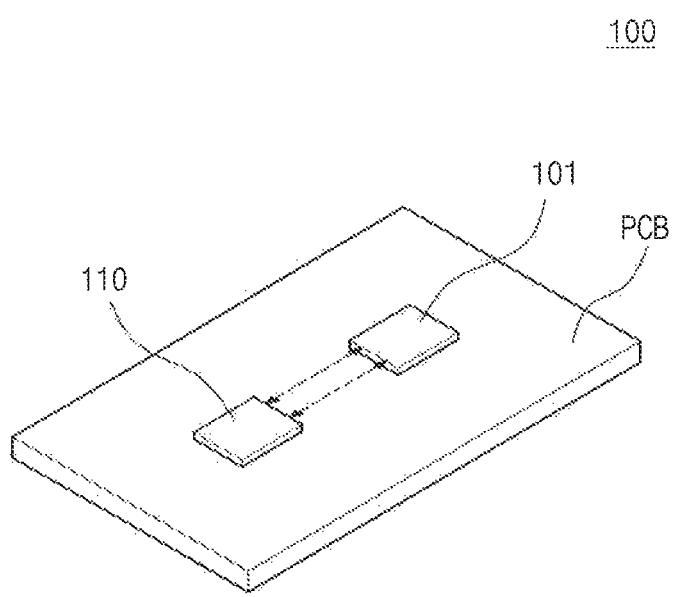
FIGS. 6 through 8 s step S120 of FIG. 3.
Figure 7:
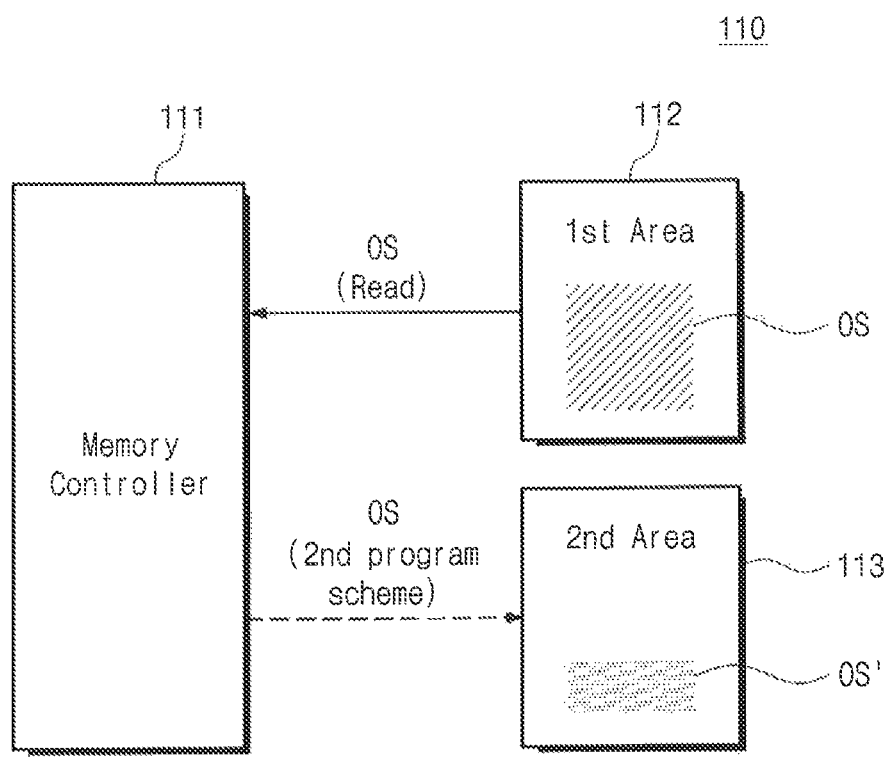
Figure 8:
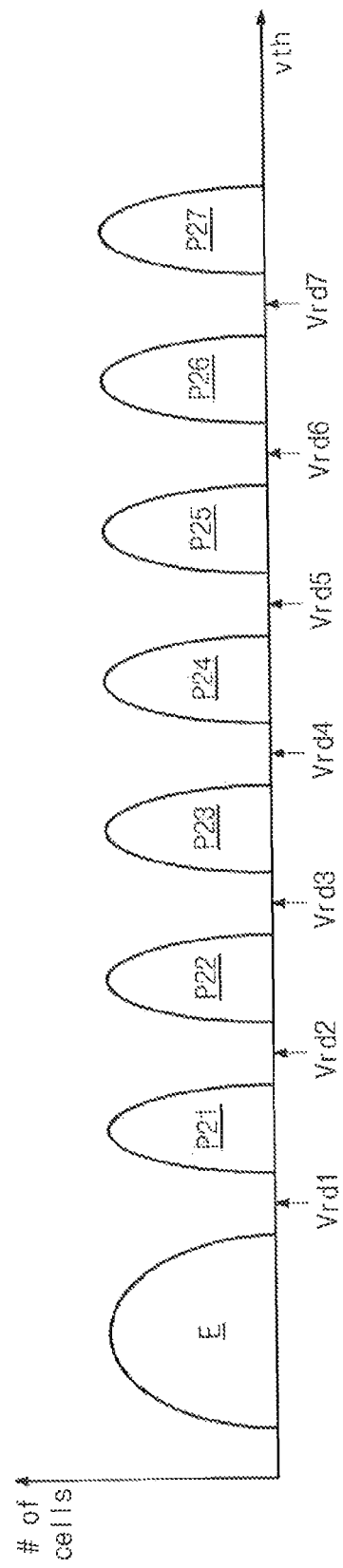

FIGS. 6 through 8 show step S120 of FIG. 3.

Referring to FIGS. 6 through 8, each of the application processor 101 and the nonvolatile memory system 110 is mounted on a printed circuit board (PCB) using a surface mount technology. However, the inventive concept is not limited thereto. For example, the application processor 101 and the nonvolatile memory system 110 may be packaged in one package, one module, or etc.

In the case that the application processor 101 and the nonvolatile memory system 110 are mounted on a printed circuit board (PCB), the application processor 101 and the nonvolatile memory system 110 are electrically connected to each other to exchange signals with each other.

For a first booting operation after the application processor 101 and the nonvolatile memory system 110 are mounted on the PCB, the application processor 101 transmits an initial operation request RQ_int to the nonvolatile memory system 110.

As illustrated in FIG. 7, the operating system image OS stored in the first area 112 is migrated to the second area 113 in response to the initial operation request RQ_int. For example, the memory controller 111 reads the operating system image OS stored in the first area 112 in response to the received initial operation request RQ_int. The memory controller 111 programs the operating system image OS in the second area 113 on the basis of the second programming scheme.

The second programming scheme may be a multi level cell programming scheme. The multi level cell programming scheme includes an erase state E and a plurality of program states P21~P27. If memory cells are programmed using the second programming scheme, the memory cells may have one of the erase state E and the plurality of program states P21~P27. The multi level cell programming scheme may include a high speed program (HSP), a one shot program, a shadow program, etc.

Figure 9:
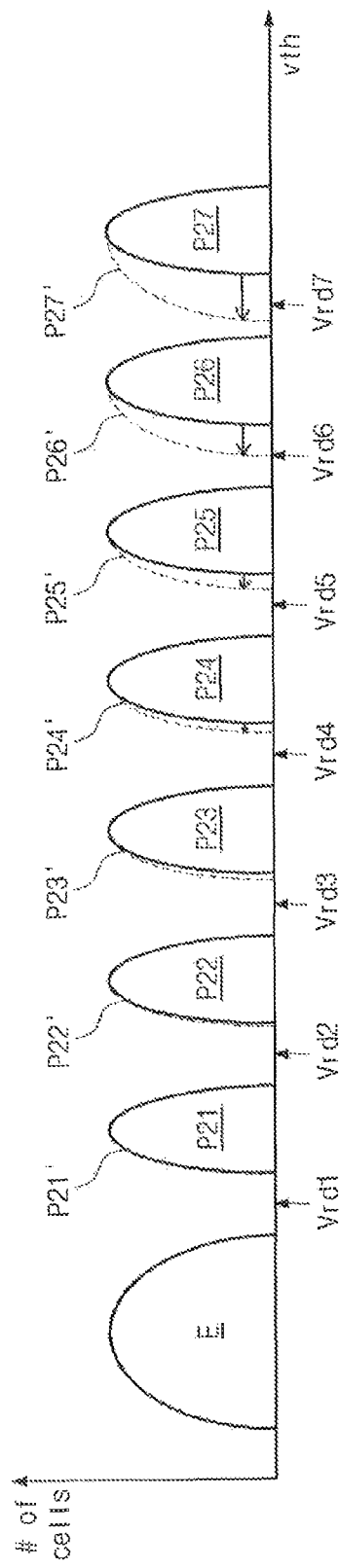
FIGS. 9 through 11 show step S130 of FIG. 3.
Figure 10:
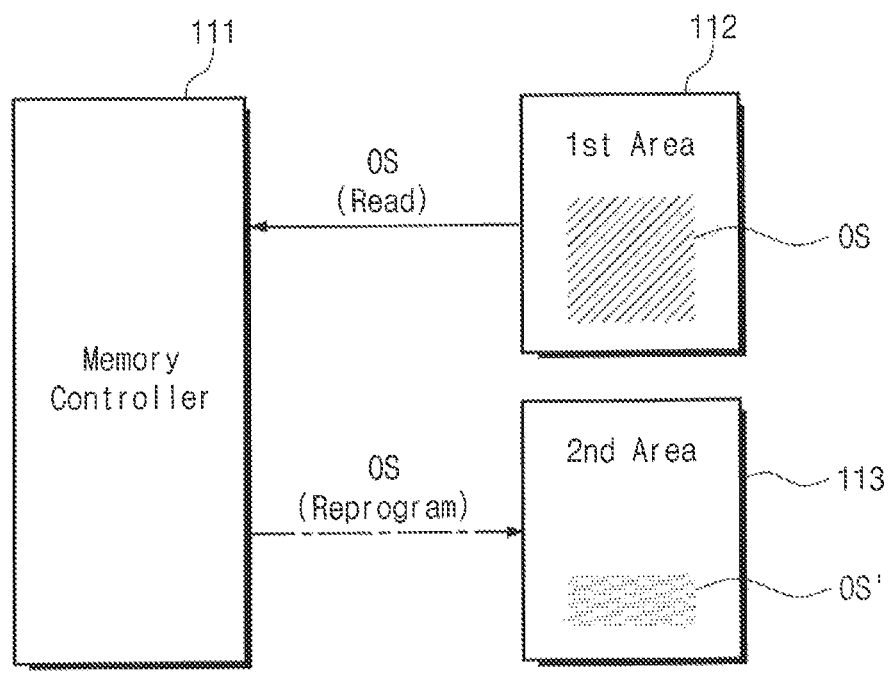
Figure 11:
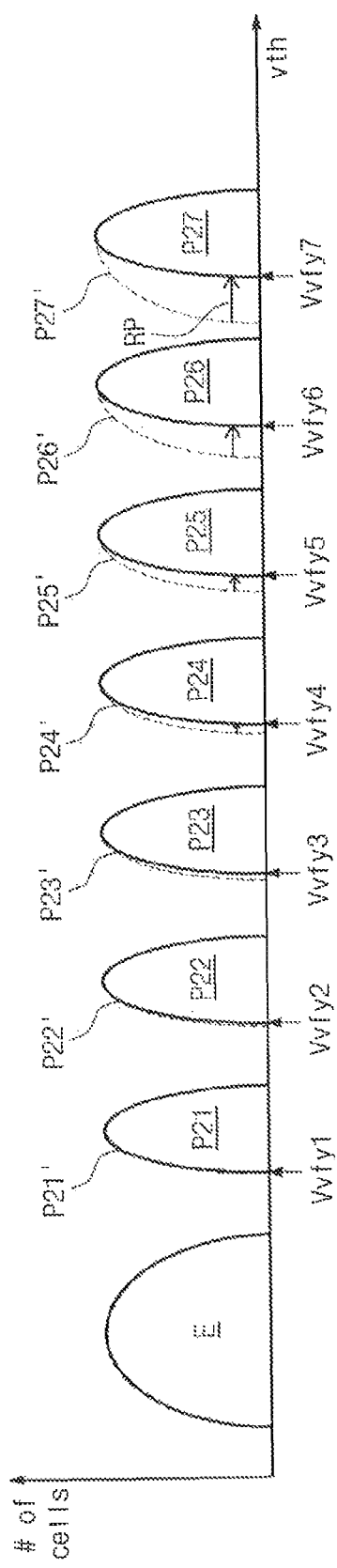

FIGS. 9 through 11 show step S130 of FIG. 3.

Referring to FIGS. 1, 8 and 9, memory cells in the second area 113, as illustrated in FIG. 8, are programmed based on the second programming scheme.

Memory blocks included in the second area 113 may have a three-dimensional structure. Memory cells included in the memory blocks having a three dimensional structure may be charge trap flash (CTF) memory cells. For the charge trap flash (CTF) memory cell, charges are trapped in a charge storage layer after being programmed. Charges trapped in the charge storage layer may flow into a channel layer so that as time elapses after memory cells are programmed, a threshold voltage of the memory cells may be lowered. Such change in the threshold voltage of the memory cells causes data stored in the memory cells to be lost. In exemplary embodiments, the physical characteristic may include an initial verify shift (IVS) phenomenon.

For example, CTF memory cells may be programmed to have one of the erase state F and the plurality of program states P21~P27. The program states of the memory cells may be distinguished from each other using first through seventh read voltages Vrd1~Vrd7 to read data stored in the memory cells. As illustrated in FIG. 9, a threshold voltage distribution of the memory cells may be changed into a plurality of program states P21'~P27' due to the physical characteristic of the CTF memory cells. The program states (or read data) distinguished by the first through seventh read voltages Vrd1~Vrd7 may include an error due to changes in the threshold distribution. Compared with program states (or data) using the first program scheme, the probability of the error occurring may be greater in program states which is programmed using the second program scheme.

The nonvolatile memory system 110, as illustrated in FIG. 10, reprograms the operating system image OS' stored in the second area 113 after completing the migration operation of S120. For example, the memory controller 111 reads the operating system image OS stored in the first area 112 again and reprogram the read operating system image OS' in the second area 113 after completing the migration operation described with reference to FIGS. 7 and 8. At this time, the memory controller 111 reprograms the operating system image OS' stored in the second area 113 without erasing the second area 113 in which the operating system image OS' is stored.

Reprogramming data in the second area 113 indicates an operation of programming data stored in the second area 113 without erasing the data.

As illustrated in FIG. 11, memory cells of the second area 113 in which the operating system image OS' is stored may have any one of the erase state E and the program states P21'~P27' by the IVS phenomenon. At this time, the memory controller 111 reprograms the memory cells of the second area 113 on the basis of first through seventh program verify voltages Vvfy1~Vvfy7.

A program start voltage, a program voltage increment, the number of times of program loops, a program verify voltage, or a pulse width of a program voltage of the reprogram operation may be equal to that of the second programming scheme. The inventive concept is not limited thereto. For example, a program start voltage and a program voltage increment of the reprogram operation may be higher than that of the second programming scheme. For example, the number of times of program loops of the reprogram operation may be smaller than that of the second programming scheme.

The memory cells of the second area 113 are programmed to have one of the erase state E and the program states P21~P27 by the reprogram operation. A threshold voltage change amount of the reprogrammed memory cells in the second area 113 due to an elapsed time is smaller than that of the memory cells before being reprogrammed in the second area 113. Since a threshold voltage change amount due to the IVS phenomenon becomes small by reprogramming the memory cells in the second area 113, reliability of the second area 113 where the operating system OS' image is stored is increased.

Figure 12:
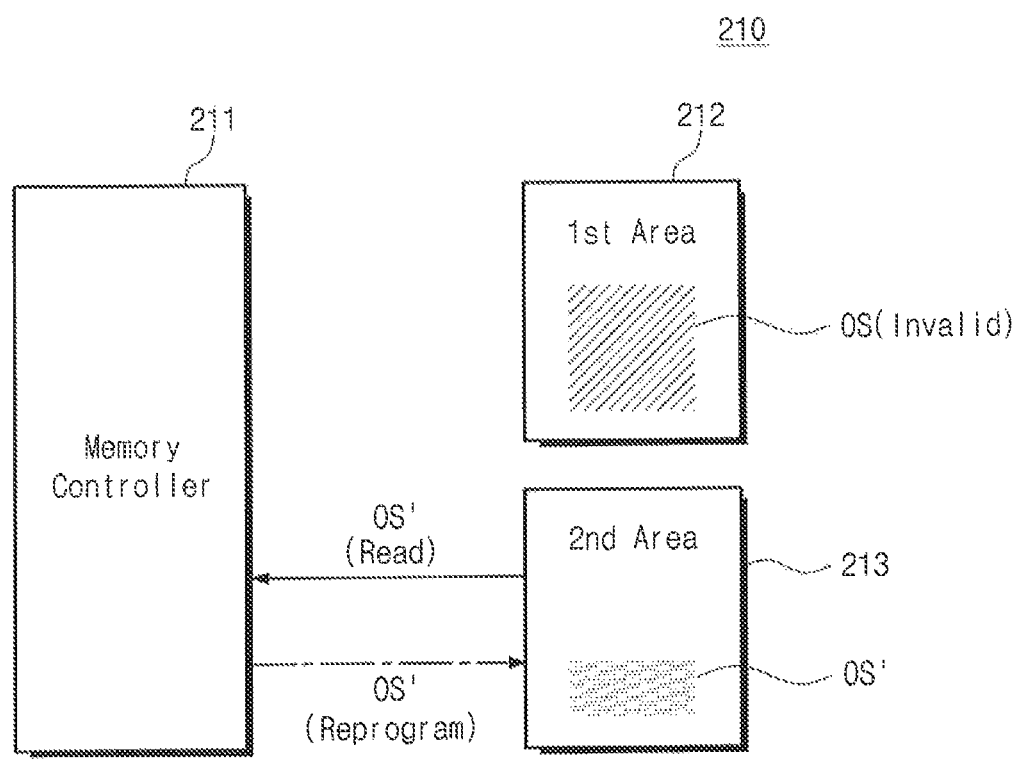
FIG. 12 is a block diagram illustrating a nonvolatile memory system in accordance with an exemplary embodiment of the inventive concept.

FIG. 12 is a block diagram illustrating a nonvolatile memory system in accordance with an exemplary embodiment of the inventive concept.

Referring to FIG. 12, a nonvolatile memory system 210 includes a memory controller 211 and first and second areas 212 and 213. The nonvolatile memory system 210 of FIG. 12 performs a similar operation to the nonvolatile memory system 110 of FIG. 1. For example, the nonvolatile memory system 210 programs an operating image OS image in the first area 212 on the basis of a first programming scheme. When the nonvolatile memory system 210 is first booted after being mounted on a printed circuit board, the nonvolatile memory system 210 migrates the operating system image OS stored in the first area 212 to the second area 213.

Unlike the nonvolatile memory system 110 of FIG. 1, when performing a reprogram operation, the nonvolatile memory system 210 reads the operating system image OS' stored in the second area 213 and reprograms the read operating system image OS' in the second area 213, For example, the memory controller 211 reads an operating system image OS' (i.g., migrated operating system image from the first area) stored in the second area 213 in response to an initial operation request RQ_int. The memory controller 211 reprograms the read operating system image OS' in the second area 213 on the basis of the reprogram operation described with reference to FIG. 11. When reading the operating system image OS' stored in the second area 213, the memory controller 211 reads the operating system OS' image using read voltages controlled according to program elapsed time.

In exemplary embodiments, after a migration operation is completed, the operating system image OS stored in the first area 212 may be invalidated. In exemplary embodiments, after a migration operation is completed, the first area 212 may be erased. In exemplary embodiments, after the reprogram operation is completed, the operating system image OS stored in the first area 212 may be invalid. In exemplary embodiments, after the reprogram operation is completed, the first area 212 may be erased.

The nonvolatile memory system 210 reads the operating system image OS' stored in the second area 213 to reprogram the read operating system image OS' in the second area 213 again. Thus, an operation method of a nonvolatile memory system having increased reliability is provided.

Figure 13:
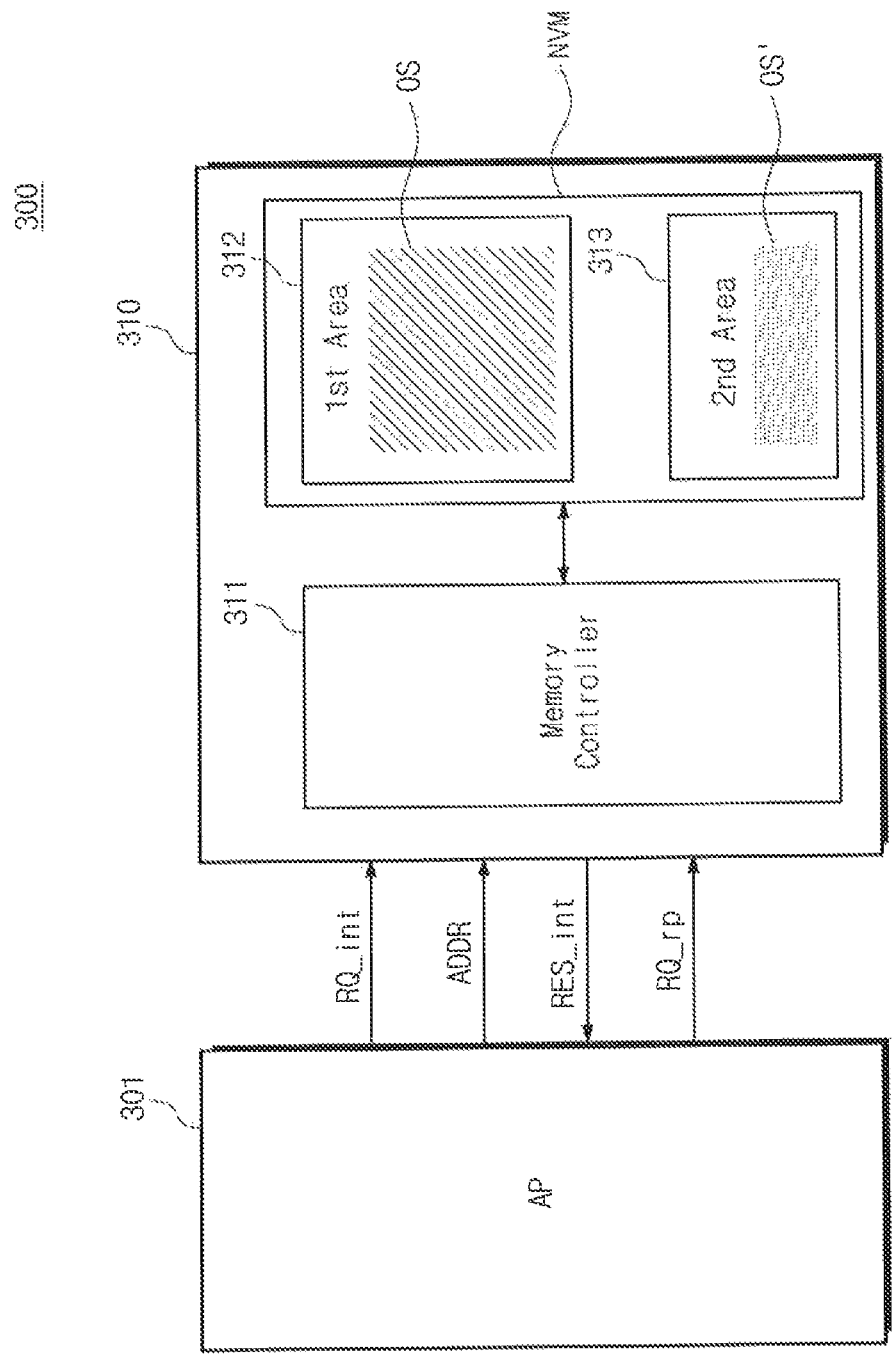
FIG. 13 is a block diagram illustrating a user system in accordance with an exemplary embodiment of the inventive concept.

FIG. 13 is a block diagram illustrating a user system in accordance with an exemplary embodiment of the inventive concept. Referring to FIG. 13, a user system 300 includes an application processor 301 and a nonvolatile memory system 310. The nonvolatile memory system 310 includes a memory controller 311 and a nonvolatile memory device NVM. The nonvolatile memory device NNW includes first and second areas 312 and 313. Since the application processor 301, the nonvolatile memory system 310, the memory controller 311, the nonvolatile memory device NVM and the first and second areas 312 and 313 are substantially similar to those described in FIG. 1, detailed descriptions thereof are omitted.

Unlike the nonvolatile memory system 110 of FIG. 1, the nonvolatile memory system 310 of FIG. 13 receives a reprogramming request RQ_rp with respect to a reprogram operation from the application processor 301 and performs a reprogram operation in response to the received reprogramming request RQ_rp. For example, in the case that the nonvolatile memory system 310 is first booted after being mounted on a printed circuit board, the application processor 301 transmits an initial operation request RQ_int to the nonvolatile memory system 310. The nonvolatile memory system 310 migrates an operating system image OS stored in the first area 312 to the second area 313.

After completing the migration operation, the nonvolatile memory system 310 transmits an initial operation response RES_int to the application processor 301. The application processor 301 transmits the reprogramming request RQ_rp to the nonvolatile memory system 310 in response to the initial operation response RES_int. In response to the reprogramming request RQ_rp, the nonvolatile memory system 310 reads the operating system image OS stored in the first area 312 and reprograms the read operating system image OS in the second area 313. Alternatively, in response to the reprogramming request RQ_rp, the nonvolatile memory system 310 reads an operating system image OS' stored in the second area 313 and reprograms the read operating system image OS' in the second area 313.

The nonvolatile memory system 310 performs a migration operation and a reprogram operation under the control of the application processor 301. Thus, an operation method of a nonvolatile memory system having increased reliability is provided.

Figure 14:
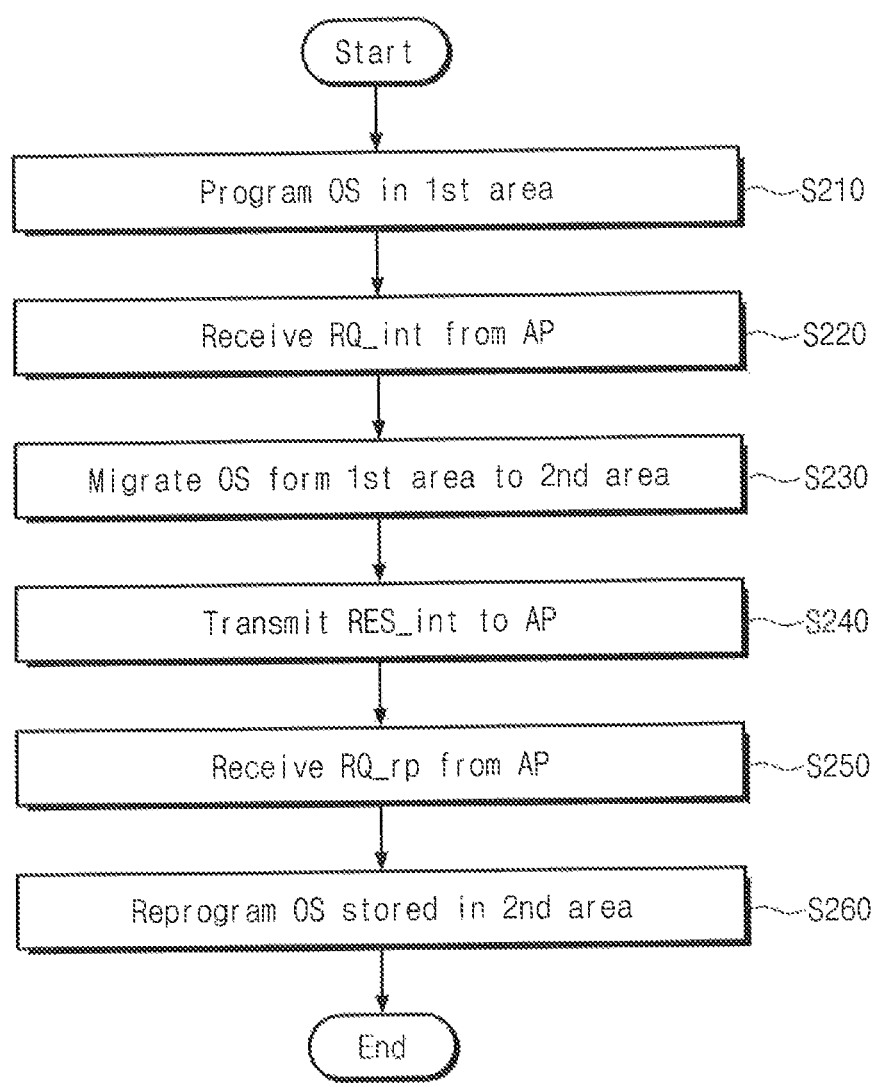
FIG. 14 is a flow chart illustrating an operation of a nonvolatile memory system illustrated in FIG. 13.

FIG. 14 is a flow chart illustrating an operation of the nonvolatile memory system illustrated in FIG. 13. Referring to FIGS. 13 and 14, instep S210, the nonvolatile memory system 310 programs an operating system image OS in the first area 312 on the basis of a first programming scheme. The first programming scheme may be a single level cell programming scheme.

In step S220, the nonvolatile memory system 310 receives an initial operation request RQ_int from the application processor 301. For example, in the case that the application processor 301 and the nonvolatile memory system 310 are first booted after being mounted on a printed circuit board using a surface mount technology (SMT), the application processor 301 transmits the initial operation request RQ-int to the nonvolatile memory system 310.

In step S230, the nonvolatile memory system 310 migrates an operating system image OS stored in the first area 312 to the second area 313. For example, the nonvolatile memory system 310 reads the operating system image OS stored in the first area 312 in response to the initial operation request RQ-int and programs the read operating system image OS in the second area 313 on the basis of a second programming scheme. The second programming scheme may be a multi level cell program method.

In step 240, the nonvolatile memory system 310 transmits an initial operation response RES_int to the application processor 301.

In step S250, the nonvolatile memory system 310 receives a reprogramming request RQ_rp from the application processor 301. For example, the application processor 301 transmits the reprogramming request RQ_rp to the nonvolatile memory system 310 in response to the initial operation completion response RES_int.

In step S260, the nonvolatile memory system 310 performs a reprogram operation. For example, the nonvolatile memory system 310 reads the operating system image OS stored in the first area 312 in response to the reprogramming request RQ_rp and reprograms the read operating system image OS in the second area 313. Alternatively, the nonvolatile memory system 310 reads an operating system OS' image stored in the second area 313 in response to the reprogramming request RQ_rp and reprograms the read operating system OS' image in the second area 313.

The nonvolatile memory system 310 performs a migration operation and a reprogram operation under the control of the application processor 301. Thus, since reliability of the operating system image OS is increased, a nonvolatile memory system having increased reliability is provided.

Figure 15:
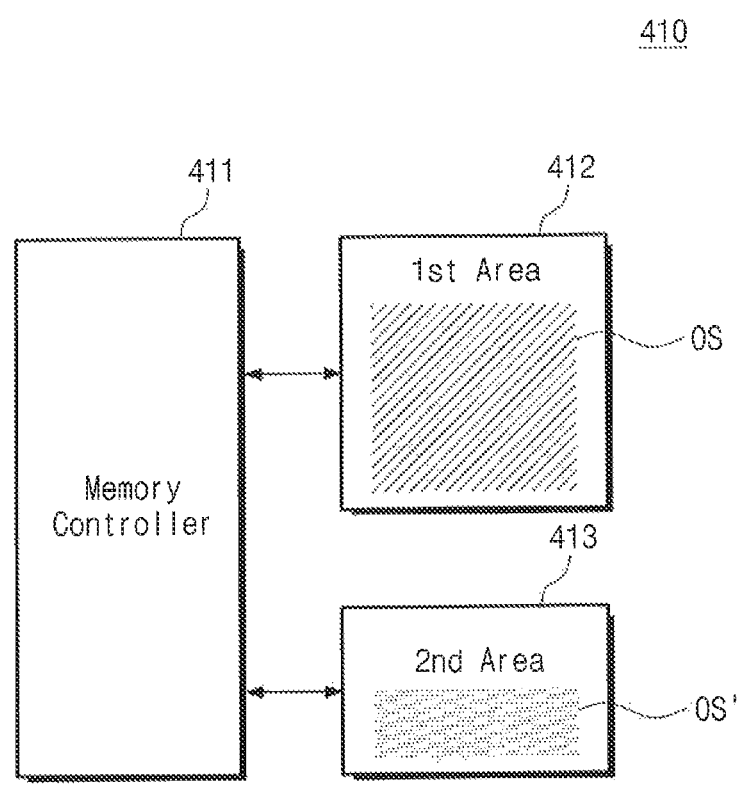
FIG. 15 is a block diagram illustrating a nonvolatile memory system in accordance with an exemplary embodiment of the inventive concept.

FIG. 15 is a block diagram illustrating a nonvolatile memory system in accordance with an exemplary embodiment of the inventive concept. Referring to FIG. 15, a nonvolatile memory system 410 includes a memory controller 411 and first and second areas 412 and 413. Since the memory controller 411 and the first and second areas 412 and 413 are substantially similar to those described in FIG. 1, detailed descriptions thereof are omitted.

Unlike the nonvolatile memory system 110 of FIG. 1, the nonvolatile memory system 410 performs a migration operation and a reprogram operation of an operating system image OS without a request of an external device (for example, the application processor 101), For example, the nonvolatile memory system 410 programs the operating system image OS in the first area 412 on a first programming scheme. In the case that the nonvolatile memory system 410 is first booted after being mounted on a printed circuit board using a surface mount technology (SMT), the nonvolatile memory system 410 performs the migration operation and the reprogram operation described with reference to FIGS. 7 through 12, For example, when being first booted (or being first powered on), the nonvolatile memory system 410 performs a migration operation and a reprogram operation of the operating system image OS.

When the nonvolatile memory system 410 is first booted after being mounted on a printed circuit board, the nonvolatile memory system 410 performs a migration operation and a reprogram operation with respect to the operating system image OS without a control of an external device (for example, an application processor). Thus, a nonvolatile memory system having increased reliability is provided.

Figure 16:
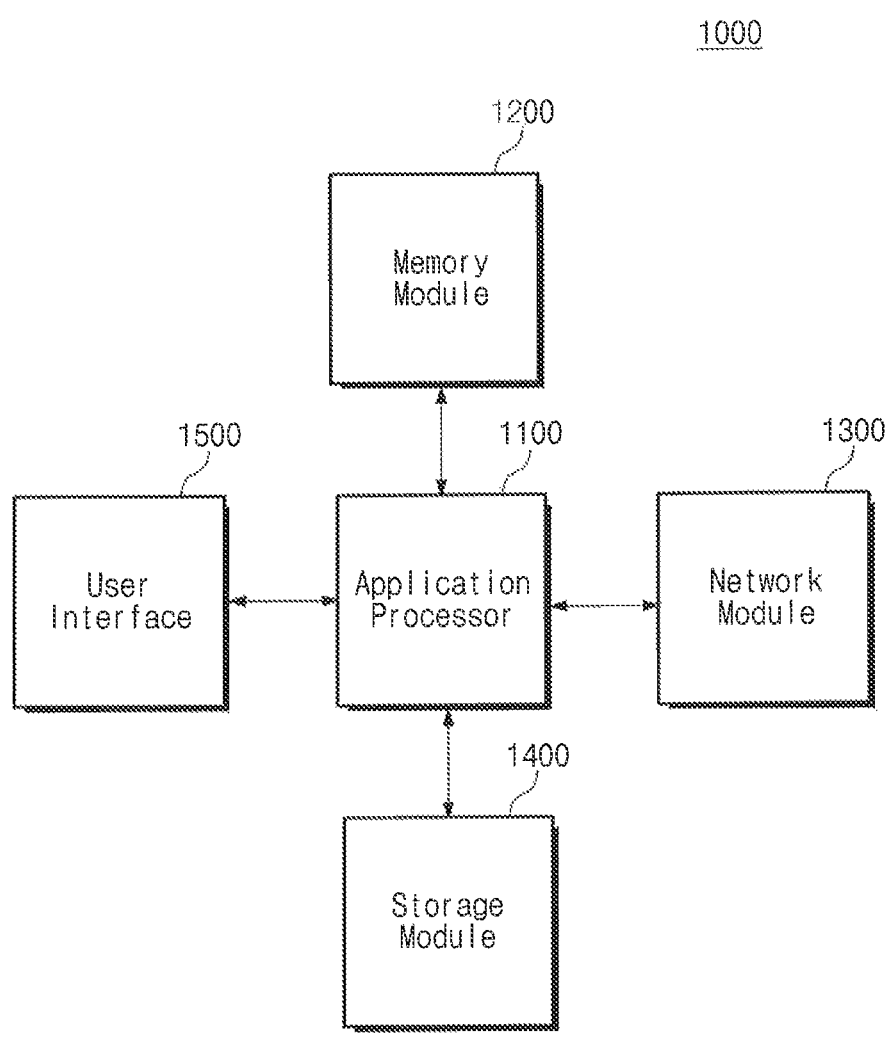
FIG. 16 is a block diagram illustrating a user system in accordance with an exemplary embodiment of the inventive concept.

FIG. 16 is a block diagram illustrating a user system in accordance with an exemplary embodiment of the inventive concept. Referring to FIG. 16, a user system 1000 includes an application processor 1100, a memory module 1200, a network module 1300, a storage module 1400, and a user interface 1500. Since the application processor 1100 is described with reference to FIG. 1, a detailed description thereof is omitted The memory module 1200 operates as a main memory, an operation memory, a buffer memory or a cache memory of the user system 1000. The memory module 1200 may include a volatile random access memory such as a dynamic random access memory (DRAM) device, a synchronous DRAM (SDRAM) device, a double-data-rate SDRAM (DDR SDRAM) device, a DDR2 SDRAM device, a DDR3 SDRAM device, a low power DDR. SDRAM (LPDDR SDRAM) device, an LPDDR2 SDRAM device, an LPDDR3 SDRAM or a nonvolatile random access memory such as a phase-change random access memory (PRAM) device, a resistive random access memory (ReRAM) device, a magnetoresistive random access memory (MRAM) device, a ferroelectric random access memory (FRAM), etc. In an exemplary embodiment, the memory module 1200 may be packaged with the application processor 1100 using packaging technologies such as Package on Package (POP), Multi Chip Package (MCP) and so on.

The network module 1300 performs a communication with external devices. The network module 1300 supports a wireless communication such as CDMA (code division multiple access), GSM (time division multiple access), LTE (long term evolution), Wimax, WLAN, UWB, Bluetooth, etc. In an exemplary embodiment, the network module 1300 may be included in the application processor 1100.

The storage module 1400 stores data. For example, the storage module 1400 stores data received from the outside. The storage module 1400 transmits data stored in the storage module 1400 to the application processor 1100. The storage module 1400 may be embodied using a nonvolatile semiconductor memory device having a three-dimensional structure such as a PRAM device, an MRAM device, a ReRAM device, a NAND flash device, a NOR flash device, etc.

The storage module 1400 may include a nonvolatile memory system in accordance with an exemplary embodiment. In this case, the storage module 1400 operates on the basis of the operation method described with reference to FIGS. 1 through 15.

The user interface 1500 may include interfaces inputting data or a command to the user system 1000 or outputting data to an external device. The user interface 1500 may include input devices such as a camera, a touch screen, an operation recognition module, a mike, etc. or output devices such as a display, a speaker, a touch screen, etc.

Each constituent element or more than two constituent elements included in the user system 1000 may be packaged in one chip. Each chip of the constituent elements may be mounted on one printed circuit board to constitute the user system 1000. When the constituent elements are first booted after being mounted, the storage module 1400 may operate based on the method described with reference to FIGS. 1 through 15. Thus, a nonvolatile memory system having increased reliability is provided.

According to an exemplary embodiment of the inventive concept, a nonvolatile memory system stores an operating system image in a first area on the basis of a first programming scheme. When a nonvolatile memory system is first booted after being mounted on a printed circuit board, the nonvolatile memory system stores an operating system image in a second area on the basis of a second programming scheme. After that, the nonvolatile memory system reprograms the operating system image in the second area so that the reliability of the operating system image is increased. Thus, a nonvolatile memory system having increased reliability is provided.

According to an exemplary embodiment of the inventive concept, when a nonvolatile memory system is first booted after being mounted on a printed circuit board, a migration operation and a reprogram operation are performed so that the reliability of data is increased, Thus, a nonvolatile memory system having increased reliability and an operation method thereof are provided.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. An operating method of a nonvolatile memory system including first and second areas comprising:
   storing data in the first area;
   migrating data stored in the first area to the second area in a first booting operation; and
   reprogramming the data stored in the second area,
   wherein the first booting operation is performed upon the nonvolatile memory system being first powered on after mounted on a printed circuit board, and
   wherein the reprogramming is a program operation performed on the data stored in the second area without performing an erasing operation on the data stored in the second area.

2. The operating method of claim 1,
   wherein the storing of the data is performed before the nonvolatile memory system is mounted on the printed circuit board,
   wherein the data stored in the first area is written on the basis of a first programming scheme, and
   wherein the migrating of the data comprises:
      reading the data stored in the first area from the first area; and
      writing the data read from the first area to the second area on the basis of a second programming scheme.

3. The operating method of claim 2,
   wherein the data stored in the first area includes an operating system image.

4. The operation method of claim 2,
   wherein the first programming scheme is a single level cell programming scheme and the second programming scheme is a multi level cell programming scheme.

5. The operating method of claim 4,
   wherein program verify voltages of the reprogram operation are the same as program verify voltages of the second programming scheme.

6. The operating method of claim 1,
   wherein the reprogramming of the data comprises:
      reading the data stored in the first area from the first area; and
      writing the data read from the first area to the second area,
   wherein the migrating of data and the reprogramming of the data occur at the same memory cells of the second area.

7. The operating method of claim 1,
   wherein the reprogramming of the data comprises:
      reading the data stored in the second area from the second area; and
      writing the data read from the second area to the second area, wherein the migrating of data and the reprogramming of the data occur at the same memory cells of the second area.

8. The operating method of claim 7,
   wherein the reading of the data stored in the second area is performed using a plurality of read voltages controlled according to an elapsed time after the data is written to the second area.

9. The operating method of claim 1,
   wherein the first and second areas comprise
   a plurality of memory blocks, each memory block comprises a plurality of strings, and each string comprises a plurality of memory cells stacked in a direction perpendicular to a substrate, a string select transistor being disposed between the memory cells and a bit line; and
   a ground select transistor being disposed between the memory cells and the substrate.

10. The operating method of claim 9,
    wherein each memory cell is a charge trap flash (CTF) memory cell.

11. The operating method of claim 1,
    wherein the migrating of the data is performed in response to an initial operation request received from an external device.

12. The operating method of claim 11,
    wherein the reprogramming of the data is performed in response to a reprogramming request received from the external device.

* * * * *